(12) United States Patent
Pasqualini

(10) Patent No.: US 7,265,599 B1
(45) Date of Patent: Sep. 4, 2007

(54) FLIPFLOP THAT CAN TOLERATE ARBITRARILY SLOW CLOCK EDGES

(75) Inventor: Ronald Pasqualini, Los Altos, CA (US)

(73) Assignee: National Semiconductor Corporation, Santa Clara, CA (US)

(*) Notice: Subject to any disclaimer, the term of this patent is extended or adjusted under 35 U.S.C. 154(b) by 34 days.

(21) Appl. No.: 10/997,290

(22) Filed: Nov. 24, 2004

(51) Int. Cl.
*H03K 3/00* (2006.01)

(52) U.S. Cl. .............. 327/202; 327/211; 327/212; 327/215; 327/218

(58) Field of Classification Search .............. 327/202, 327/210–212, 215, 218
See application file for complete search history.

(56) References Cited

U.S. PATENT DOCUMENTS 3,467,839 A * 9/1969 Miller ................... 327/216
3,609,569 A * 9/1971 Todd .................... 327/202
4,002,933 A * 1/1977 Leuschner .............. 327/216
4,209,715 A * 6/1980 Aoki ..................... 327/218
5,324,996 A * 6/1994 Mote, Jr. ................ 326/21
5,781,053 A * 7/1998 Ramirez ................. 327/215

* cited by examiner

*Primary Examiner*—Kenneth B. Wells
(74) *Attorney, Agent, or Firm*—Mark C. Pickering (57) ABSTRACT

A edge triggered flipflop tolerates arbitrarily slow clock edge rates by utilizing complex gates, with weighted transistors, to electrically isolate the master latch from the data inputs, before the master latch and the slave latch are electrically connected together, and to electrically isolate the master latch from the slave latch, before the master latch and the data inputs are electrically connected together.

27 Claims, 5 Drawing Sheets

FLIPFLOP THAT CAN TOLERATE ARBITRARILY SLOW CLOCK EDGES

BACKGROUND OF THE INVENTION

1. Field of the Invention

The present invention relates to flipflops and, more particularly, to an edge triggered flipflop that can tolerate arbitrarily slow clock edge rates.

2. Description of the Related Art

A D flipflop is a logic element that has a D input, a clock input and a Q output, where the state of the Q output depends upon the state of the D input when a triggering clock edge is detected. A rising edge triggered D flipflop is a flipflop where the triggering or active clock edge is the rising clock edge. Similarly, a falling edge triggered D flipflop is a flipflop where the triggering or active clock edge is the falling clock edge.

Figure 1A:
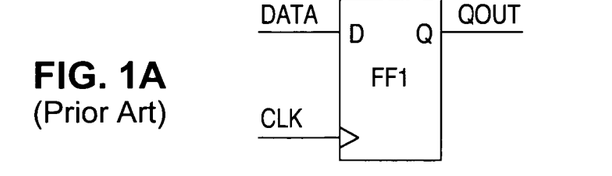
FIG. 1A is a circuit symbol illustrating a prior-art, rising edge triggered D flipflop FF1.
Figure 1B:
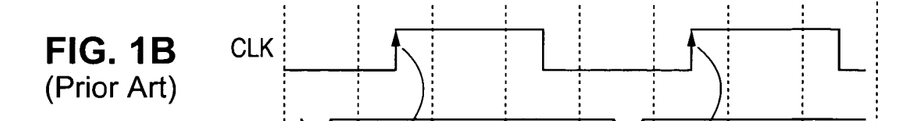
FIGS. 1B-1D are timing diagrams illustrating the operation of rising edge triggered flipflop FF1.
Figure 1C:
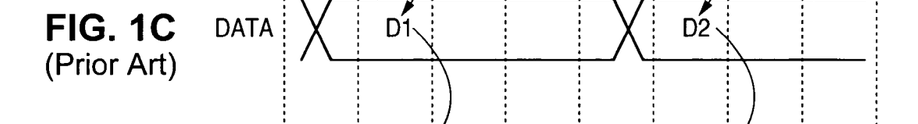
Figure 1D:
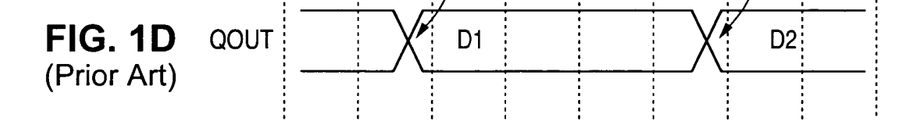
Figure 2A:
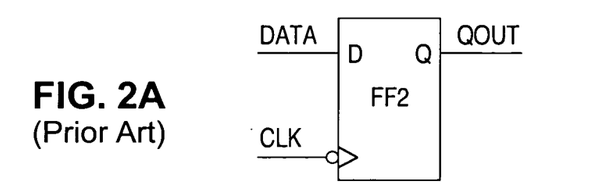
FIG. 2A is a circuit symbol illustrating a prior-art, falling edge triggered D flipflop FF2.

FIG. 1A shows a circuit symbol that illustrates a prior-art, rising edge triggered D flipflop FF1, while FIG. 2A shows a circuit symbol that illustrates a prior-art, falling edge triggered D flipflop FF2. FIGS. 1B-1D show timing diagrams that illustrate the operation of rising edge triggered flipflop FF1, while FIGS. 2B-2D show timing diagrams that illustrate the operation of falling edge triggered flipflop FF2.

As shown in FIGS. 1A and 2A, flipflops FF1 and FF2 both have a D input, a clock input and a Q output. As shown in FIGS. 1B-1D, the logic state on the D input of flipflop FF1, as illustrated by the data signal DATA, is captured on the rising edge of the clock signal CLK. In addition, the state of the Q output, as illustrated by the output signal QOUT, assumes the state of the D input a propagation time after the rising edge of the clock signal.

Figure 2B:
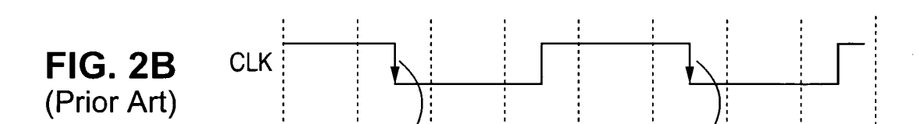
FIGS. 2B-2D are timing diagrams illustrating the operation of falling edge triggered flipflop FF2.
Figure 2C:
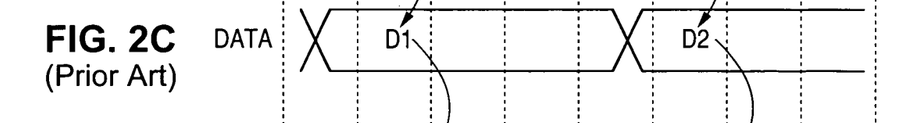
Figure 2D:
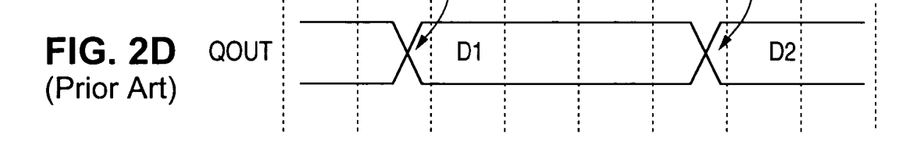

Similarly, as shown in FIGS. 2B-2D, the logic state on the D input of flipflop FF2, as illustrated by the data signal DATA, is captured on the falling edge of the clock signal CLK. In addition, the state of the Q output, as illustrated by the output signal QOUT, assumes the state of the D input a propagation time after the falling edge of the clock signal. Thus, as shown in FIGS. 1A-1D and 2A-2D, an edge triggered flipflop can be clocked by either a rising clock edge or a falling clock edge.

No matter which clock edge is used to clock an edge triggered flipflop, the clock edge rate is of critical importance. Thus, if the active clock edge is extremely fast (short rise time), most flipflops will be able to correctly respond to it. On the other hand, if the active clock edge is extremely slow (long rise time), most flipflops will not correctly respond to it. In this case, input data on the D input of the flipflop will directly "flow-through" to the Q output of the flipflop.

In other words, when the active clock edge transition occurs very slowly, a logic signal change on the D input pin of the flipflop can directly propagate to the Q output pin of the flipflop. Of course, when this "flow-through" action occurs, it causes the flipflop to behave like a flow-through latch instead of an edge triggered flipflop. In this case, the flipflop has malfunctioned because it is no longer behaving as an edge triggered logic element.

Figure 3:
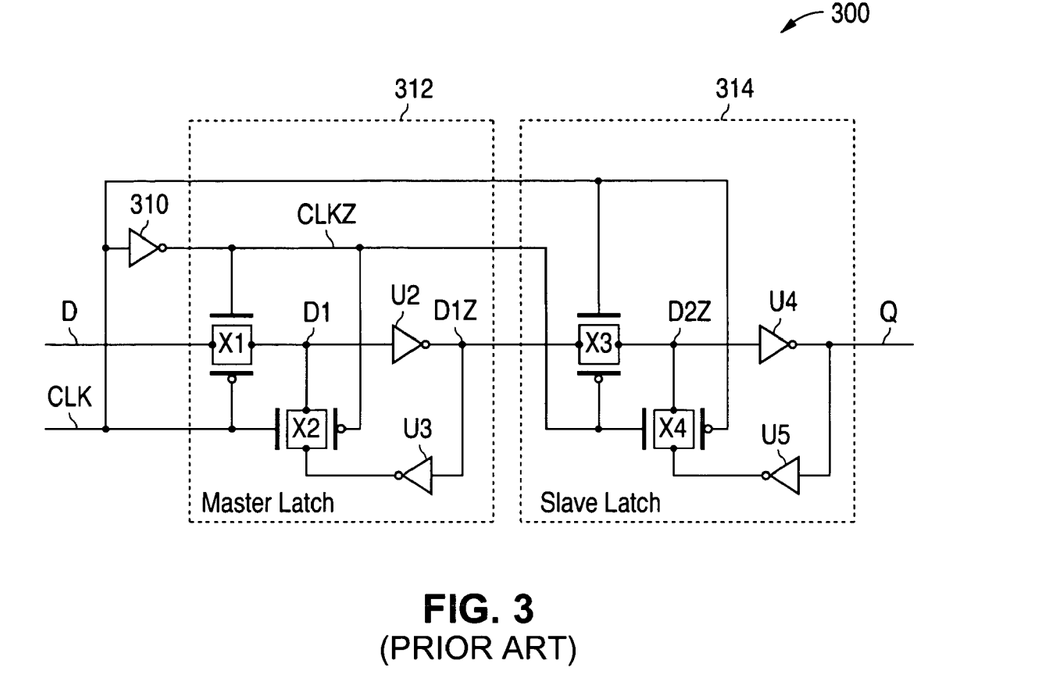
FIG. 3 is a circuit diagram illustrating a prior-art, rising edge triggered D flipflop 300.

FIG. 3 shows a circuit diagram that illustrates a prior-art, rising edge triggered D flipflop 300. As shown in FIG. 3, flipflop 300 includes an inverter 310, a master latch 312, and a slave latch 314. Inverter 310 generates an inverted clock signal CLKZ, in response to a clock signal CLK.

Master latch 312 has two transmission gates X1 and X2 and two inverters U2 and U3. Transmission gate X1 has an input connected to the D input of flipflop 300, and an output connected to an intermediate node D1. Inverter U2 has an input connected to intermediate node D1, and an output connected to the master latch output node D1Z. Inverter U3 has an input connected to the master latch output node D1Z, and an output connected to the input of transmission gate X2. The output of transmission gate X2 is connected to intermediate node D1.

Similarly, slave latch 314 also has two transmission gates X3 and X4 and two inverters U4 and U5. Transmission gate X3 has an input connected to the master latch output node D1Z, and an output connected to an intermediate node D2Z. Inverter U4 has an input connected to intermediate node D2Z, and an output connected to the Q output of flipflop 300. Inverter U5 has an input connected to the Q output, and an output connected to the input of transmission gate X4. The output of transmission gate X4 is connected to intermediate node D2Z.

In operation, when the clock signal CLK is low and the inverted clock signal CLKZ is high, transmission gate X1 will be on and transmission gate X2 will be off. Since transmission gate X1 is on, the logic state on the D input of flipflop 300 can propagate through transmission gate X1, inverter U2, and through inverter U3.

However, since transmission gate X2 is off, the output of inverter U3 cannot drive intermediate node D1. In other words, the master latch loop is open, and thus changes in the logic state on the D input of flipflop 300 can propagate through master latch 312, up to the output of inverter U3.

When the clock signal CLK is high and the inverted clock signal CLKZ is low, transmission gate X1 will be off and transmission gate X2 will be on. Since transmission gate X2 is on, the logic state on intermediate node D1 can propagate through inverter U2, inverter U3, and transmission gate X2. In other words, the master latch loop is closed, and thus master latch 312 cannot respond to changes in the logic state on the D input of flipflop 300 because transmission gate X1 is off.

With respect to slave latch 314, when the clock signal CLK is high, transmission gate X3 will be on and transmission gate X4 will be off. Since transmission gate X3 is on, the logic state on master latch output node D1Z can propagate through transmission gate X3, inverter U4 and inverter U5. However, since transmission gate X4 is off, the output of inverter U5 cannot drive node D2Z. In other words, the slave latch loop is open, and thus changes in the logic state on master latch output node D1Z can propagate through slave latch 314, up to the output of inverter U5.

When the clock signal CLK is low and the inverted clock signal CLKZ is high, transmission gate X3 will be off and transmission gate X4 will be on. Since transmission gate X4 is on, the logic state on intermediate node D2Z can propagate through inverter U4, inverter U5 and transmission gate X4. In other words, the slave latch loop is closed, and thus slave latch 314 can not respond to changes in the logic state on master latch output node D1Z because transmission gate X3 is off.

In summary, when the clock signal CLK is low, master latch output node D1Z is logically connected to the D input of flipflop 300, but is logically disconnected from the Q output of flipflop 300. Furthermore, when the clock signal CLK is high, master latch output node D1Z is logically connected to the Q output of flipflop 300, but is logically disconnected from the D input of flipflop 300.

Referring to FIG. 3, when the clock signal CLK is rising, the inverted clock signal CLKZ will be falling (and vice versa). Thus, when the clock signal CLK changes its logic state very slowly, the inverted clock signal CLKZ will also change its logic state very slowly. In this case, the CLK and CLKZ signals cannot be considered to be logical complements of each other because they can both be at the same voltage level for a considerable amount of time.

As shown in FIG. 3, if the clock signal CLK and the inverted clock signal CLKZ are both at the same voltage level, the master latch transmission gate X1 and the slave latch transmission gate X3 can both be on at the same time. This condition can cause the D input of flipflop 300 to "flow-through" (i.e., directly propagate) to the Q output of flipflop 300, causing a logic malfunction. Thus, in order to eliminate this malfunction, there is a definite need for a flipflop that can respond to arbitrarily slow clock edge rates without causing flow-through.

DETAILED DESCRIPTION OF THE INVENTION

Figure 4:
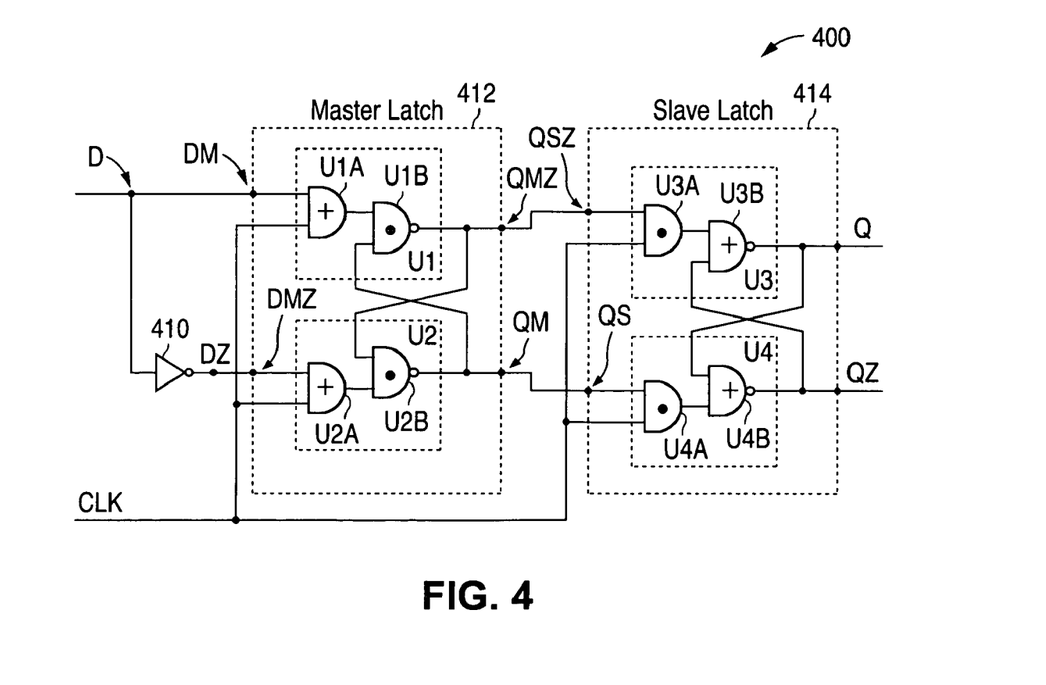
FIG. 4 is a logic diagram illustrating an example of a rising edge triggered D flipflop 400 in accordance with the present invention.

In accordance with the present invention, FIG. 4 shows a logic diagram that illustrates an example of a rising edge triggered D flipflop 400. As described in greater detail below, flipflop 400 tolerates arbitrarily slow clock edge rates by utilizing a number of complex gates to form master and slave latches. These complex gates eliminate D-to-Q flow-through by utilizing weighted transistors. These transistors logically disconnect the master latch from the data inputs before the master latch and the slave latch are logically connected together, and logically disconnect the master latch from the slave latch before the master latch and the data inputs are logically connected together.

As shown in FIG. 4, flipflop 400 includes a flipflop input node D, a flipflop input node DZ, and an inverter 410 that is connected between the flipflop input nodes D and DZ. In addition, flipflop 400 also includes a master latch 412 that has a master latch input node DM, and a master latch input node DMZ. As shown in FIG. 4, master latch input nodes DM and DMZ correspond to the flipflop input nodes D and DZ, respectively. Master latch 412 also has a master latch output node QMZ, and a master latch output node QM.

As shown in FIG. 4, master latch 412 is composed of two cross-coupled complex gates U1 and U2, which are both OR-AND-INVERT (OAI) gates. In the FIG. 4 example, complex gate U1 includes an OR gate U1A and a NAND gate U1B. OR gate U1A has an output, and a first input connected to the master latch input node DM, to receive the data input to flipflop 400. In addition, OR gate U1A also has a second input connected to the clock input of flipflop 400, to receive a clock signal CLK. NAND gate U1B has an output that generates a first intermediate signal on master latch output node QMZ, an input connected to the output of OR gate U1A, and an input connected to the output of complex gate U2.

Complex gate U2 includes an OR gate U2A and a NAND gate U2B. OR gate U2A has an output, and a first input connected to master latch input node DMZ, to receive an inverted data signal from inverter 410. Furthermore, OR gate U2A also has a second input connected to the clock input of flipflop 400, to receive the clock signal CLK. NAND gate U2B has an output that generates a second intermediate signal on master latch output node QM, an input connected to the output of OR gate U2A, and an input connected to the output of complex gate U1.

As further shown in FIG. 4, flipflop 400 includes a slave latch 414 that has a slave latch input node QSZ, a slave latch input node QS, a flipflop output node Q, and a flipflop output node QZ. Referring to FIG. 4, slave latch 414 is composed of two cross-coupled complex gates U3 and U4, which are AND-OR-INVERT (AOI) gates. As a result, slave latch 414 is the logical dual of master latch 412, which is composed of two cross-coupled OR-AND-INVERT (OAI) gates. Thus a key advantage of the present invention is that flipflop 400 does not require the complement of the clock signal (e.g., the inverted clock signal CLKZ).

As shown in the FIG. 4 example, complex gate U3 includes an AND gate U3A and a NOR gate U3B. AND gate U3A has an output, and a first input connected to slave latch input node QSZ, to receive the first intermediate signal from master latch output QMZ. Furthermore, AND gate U3A also has a second input connected to the clock input of flipflop 400, to receive the clock signal CLK. NOR gate U3B has an output that generates a signal on the flipflop output Q, an input connected to the output of AND gate U3A, and an input connected to the output of complex gate U4.

Complex gate U4 includes an AND gate U4A and a NOR gate U4B. AND gate U4A has an output, and a first input connected to slave latch input node QS, to receive the second intermediate signal from master latch output QM. Furthermore, AND gate U4A also has a second input connected to the clock input of flipflop 400, to receive the clock signal CLK. NOR gate U4B has an output that generates an inverted signal on flipflop output node QZ, an input connected to the output of AND gate U4A, and an input connected to the output of complex gate U3.

In operation, when the clock signal CLK is low, master latch 412 is logically disconnected from slave latch 414 because the low clock signal CLK forces the outputs of the slave latch AND gates U3A and U4A to be low. This puts slave latch 414 into a re-circulation mode, where the existing slave latch data is retained.

Furthermore, when the clock signal CLK is low, master latch 412 is logically connected to the flipflop input nodes D and DZ, to receive the data and inverted data signals. This connection occurs because the low clock signal CLK allows the data and inverse data signals on the flipflop input nodes D and DZ to affect the outputs of the OR gates U1A and U2A of master latch 412.

Similarly, when the clock signal CLK is high, master latch 412 is logically connected to slave latch 414, because the high clock signal CLK allows the intermediate signals on the master latch output nodes QMZ and QM to affect the outputs of AND gates U3A and U4A. Furthermore, when the clock signal CLK is high, master latch 412 is logically disconnected from the data signals on the flipflop input nodes D and DZ, because the high clock signal forces the outputs of the OR gates U1A and U2A to be high. This puts master latch 412 into a re-circulation mode, where the existing master latch data is retained.

Referring again to FIG. 4, two events begin to simultaneously occur when the clock signal CLK begins to rise. First, the master latch input nodes DM and DMZ begin to be logically disconnected from the flipflop input nodes D and DZ. Second, the master latch output nodes QMZ and QM begin to be logically connected to the slave latch input nodes QSZ and QS.

Similarly, two events begin to occur simultaneously when the clock signal CLK begins to fall. First, the master latch output nodes QMZ and QM begin to be logically disconnected from the slave latch input nodes QSZ and QS. Second, the master latch input nodes DM and DMZ begin to be logically connected to the flipflop input nodes D and DZ.

The present invention implements the four disconnection/connection events described above by utilizing break-before-make switching with respect to the inputs and outputs of master latch 412. Furthermore, this break-before-make switching is based solely upon the voltage level of the clock signal CLK, and is completely independent of the rise and fall times of the clock signal CLK.

Figure 5A:
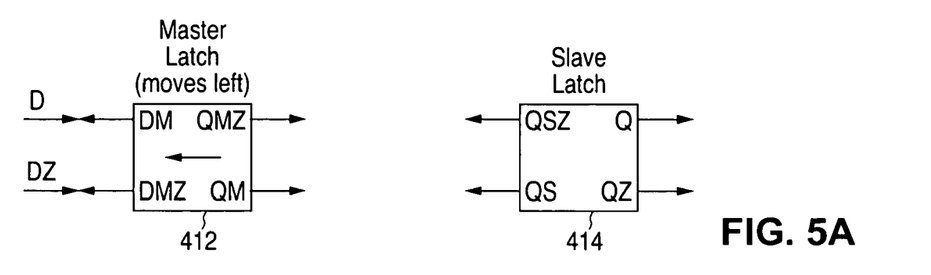
FIGS. 5A-5C are block diagrams illustrating the operation of flipflop 400 in accordance with the present invention.
Figure 5B:
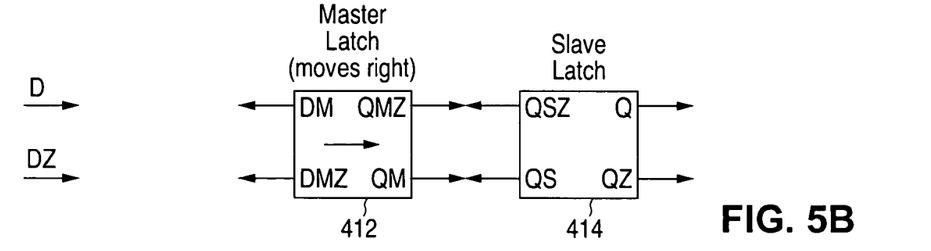
Figure 5C:
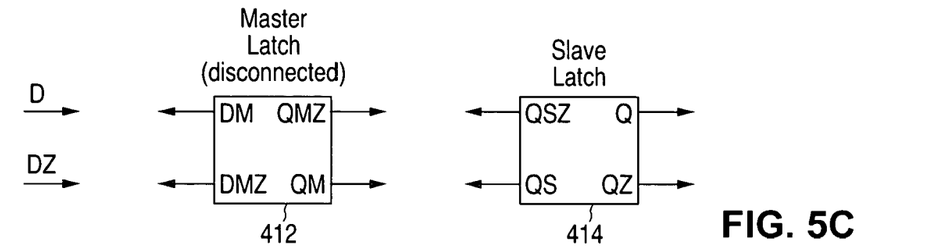

In accordance with the present invention, FIGS. 5A-5C show block diagrams that illustrate the operation of flipflop 400. Each of the figures shows a flipflop input node D and a flipflop input node DZ. Furthermore, each of the figures shows master latch 412 with a master latch input node DM and a master latch input node DMZ, that correspond with the flipflop input nodes D and DZ, respectively. Master latch 412 also has a master latch output node QMZ and a master latch output node QM.

In addition, FIGS. 5A-5C also show a slave latch 414 with a slave latch input node QSZ and a slave latch input node QS, that correspond with the master latch output nodes QMZ and QM, respectively. Slave latch 414 also has a flipflop output node Q and a flipflop output node QZ.

As shown in FIGS. 5A-5C, master latch 412 can be regarded as "shuttling" (moving) from right to left when the clock signal CLK goes from high to low, and shuttling from left to right when the clock signal CLK goes from low to high. This break-before-make switching behavior of the master latch ensures that the flipflop input nodes D and DZ will not be able to "flow-through" to the flipflop output nodes Q and QZ, even when the clock rise/fall times are arbitrarily slow.

Again referring to FIG. 5A, when the voltage of the clock signal CLK goes from high to low, master latch 412 electrically moves left. This causes the master latch output nodes QMZ and QM to be disconnected from the slave latch input nodes QSZ and QS before the master latch input nodes DM and DMZ are connected to the flipflop input nodes D and DZ.

In other words, when the clock signal CLK goes from high to low, the inputs to slave latch 414 are first locked out so that logic state changes on the master latch output nodes QMZ and QM will not have any effect upon the logic states of the flipflop output nodes Q and QZ. Following this, the master latch input nodes DM and DMZ are unlocked so that logic state changes on the flipflop input nodes D and DZ can cause the master latch output nodes QMZ and QM to change state.

Referring to FIG. 5B, when the voltage on the clock signal CLK goes from low to high, master latch 412 electrically moves to the right. This causes the master latch input nodes DM and DMZ to be disconnected from the flipflop input nodes D and DZ before the master latch output nodes QMZ and QM are connected to the slave latch input nodes QSZ and QS.

In other words, when the clock signal CLK goes from low to high, the inputs to master latch 412 are first locked out so that logic state changes on the flipflop input nodes D and DZ will not have any effect upon the logic states of the master latch output nodes QMZ and QM. Following this, the slave latch input nodes QSZ and QS are unlocked so that logic state changes on the master latch output nodes QMZ and QM can cause the flipflop output nodes Q and QZ to change state.

Referring to FIG. 5C, when the voltage on the clock signal CLK is between the logic low level and the logic high level, master latch 412 electrically moves to the middle and is totally disconnected. Thus, the master latch input nodes DM and DMZ are logically disconnected from the flipflop input nodes D and DZ, and the master latch output nodes QMZ and QM are also logically disconnected from the slave latch input nodes QSZ and QS.

As stated above, the break-before-make switching of the master latch inputs/outputs is based solely upon the voltage level on the clock signal CLK. In other words, whether the clock signal CLK is rising or falling, two different voltage thresholds (an upper threshold voltage and a lower threshold voltage) must be created for the clock signal CLK.

When the clock voltage is between ground and the lower threshold voltage, the master latch input nodes DM and DMZ are logically connected to the flipflop input nodes D and DZ, and the master latch output nodes QMZ and QM are logically disconnected from the slave latch input nodes QSZ and QS.

Similarly, when the voltage of the clock signal CLK is between the upper threshold voltage and the power supply voltage VCC, the master latch input nodes DM and DMZ are logically disconnected from the flipflop input nodes D and DZ, and the master latch output nodes QMZ and QM are logically connected to the slave latch input nodes QSZ and QS.

Furthermore, when the voltage level on the clock signal CLK is between the lower threshold voltage and the upper threshold voltage, the master latch input nodes DM and DMZ are logically disconnected from the flipflop input nodes D and DZ, and the master latch output nodes QMZ and QM are logically disconnected from the slave latch input nodes QSZ and QS.

Figure 6:
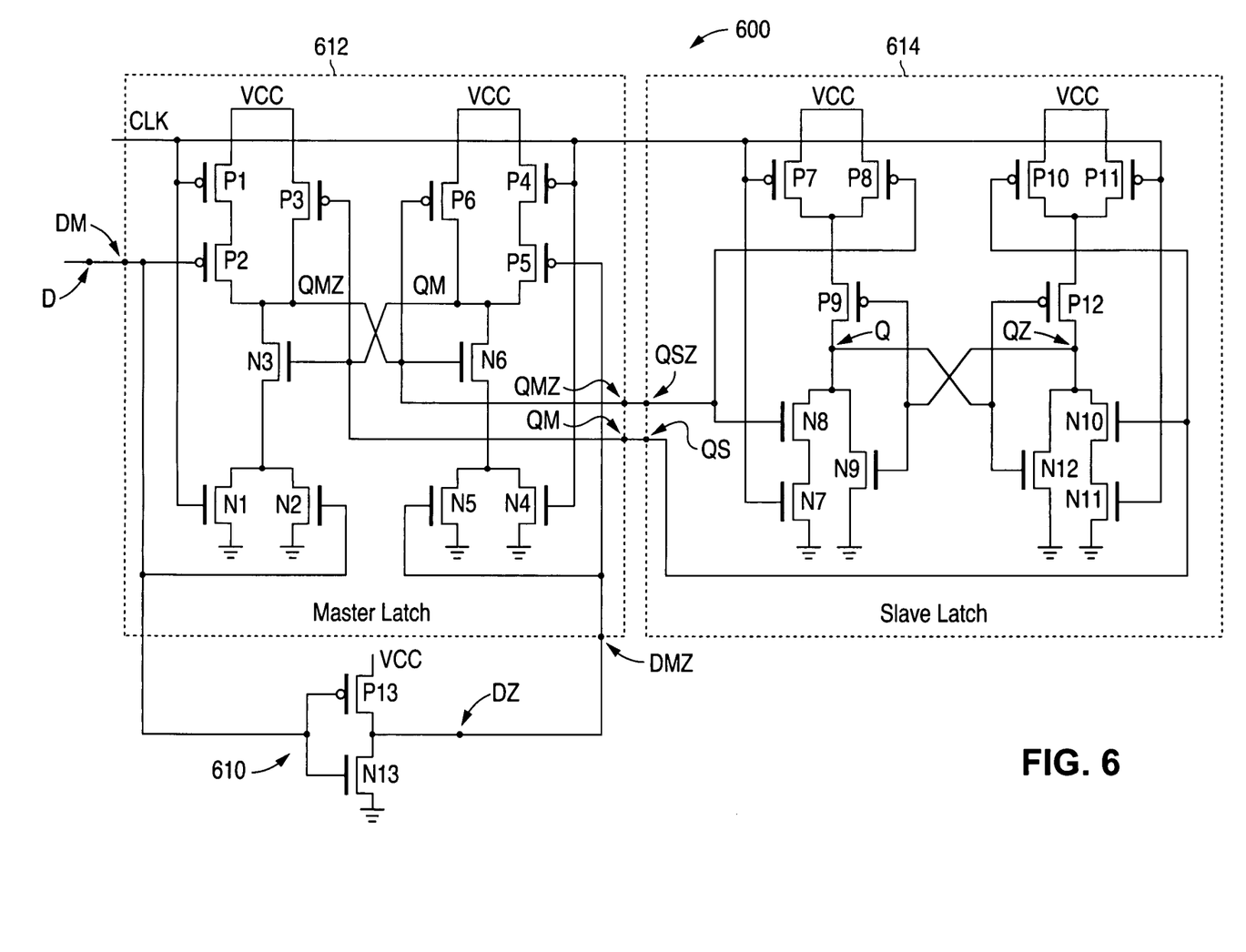
FIG. 6 is a schematic diagram illustrating an example of a rising edge triggered flipflop 600 in accordance with the present invention.

In accordance with the present invention, FIG. 6 shows a schematic diagram that illustrates a transistor level implementation of flipflop 400. As shown in FIG. 6, flipflop 600 includes a flipflop input node D, a flipflop input node DZ, and an inverter 610 that is connected between the flipflop input nodes D and DZ.

In addition, flipflop 600 also includes a master latch 612 that has a master latch input node DM and a master latch input node DMZ, that correspond with the flipflop input nodes D and DZ, respectively. Master latch 612 also has a master latch output node QMZ and a master latch output node QM. Furthermore, master latch 612 includes PMOS transistors P1-P3, and NMOS transistors N1-N3.

PMOS transistor P1 has a source connected to a power supply voltage VCC, a drain, and a gate connected to the clock input to receive the clock signal CLK. PMOS transistor P2 has a source connected to the drain of PMOS transistor P1, a drain connected to master latch output node QMZ, and a gate connected to master latch input node DM. PMOS transistor P3 has a source connected to the power supply voltage VCC, a drain connected to master latch output node QMZ, and a gate connected to master latch output node QM.

NMOS transistor N1 has a source connected to ground, a drain, and a gate connected to the clock input, to receive the clock signal CLK. NMOS transistor N2 has a source connected to ground, a drain connected to the drain of transistor N1, and a gate connected to master latch input node DM. NMOS transistor N3 has a source connected to the drains of transistors N1 and N2, a drain connected to master latch output node QMZ, and a gate connected to master latch output node QM.

In addition, master latch 612 also includes PMOS transistors P4-P6, and NMOS transistors N4-N6. PMOS transistor P4 has a source connected to the power supply voltage VCC, a drain, and a gate connected to the clock input, to receive the clock signal CLK. PMOS transistor P5 has a source connected to the drain of PMOS transistor P4, a drain connected to master latch output node QM, and a gate connected to master latch input node DMZ. PMOS transistor P6 has a source connected to the power supply voltage VCC, a drain connected to master latch output node QM, and a gate connected to master latch output node QMZ.

NMOS transistor N4 has a source connected to ground, a drain, and a gate connected to the clock input, to receive the clock signal CLK. NMOS transistor N5 has a source connected to ground, a drain connected to the drain of transistor N4, and a gate connected to master latch input node DMZ. NMOS transistor N6 has a source connected to the drains of transistors N4 and N5, a drain connected to master latch output node QM, and a gate connected to master latch output node QMZ.

As further shown in FIG. 6, flipflop 600 also includes a slave latch 614 that has a slave input node QSZ, a slave input node QS, a flipflop output node Q, and a flipflop output node QZ. Slave latch 614 also includes PMOS transistors P7-P9, and NMOS transistors N7-N9. PMOS transistor P7 has a source connected to the power supply voltage VCC, a drain, and a gate connected to the clock input, to receive the clock signal CLK. PMOS transistor P8 has a source connected to the power supply voltage VCC, a drain connected to the drain of PMOS transistor P7, and a gate connected to slave latch input node QSZ. PMOS transistor P9 has a source connected to the drains of PMOS transistors P7 and P8, a drain connected to flipflop output node Q, and a gate connected to flipflop output node QZ.

NMOS transistor N7 has a source connected to ground, a drain, and a gate connected to the clock input, to receive the clock signal CLK. NMOS transistor N8 has a source connected to the drain of NMOS transistor N7, a drain connected to flipflop output node Q, and a gate connected to slave latch input node QSZ. NMOS transistor N9 has a source connected to ground, a drain connected to flipflop output node Q, and a gate connected to flipflop output node QZ.

Slave latch 614 also includes PMOS transistors P10-P12, and NMOS transistors N10-N12. PMOS transistor P10 has a source connected to the power supply voltage VCC, a drain, and a gate connected to slave latch input node QS. PMOS transistor P11 has a source connected to the power supply voltage VCC, a drain connected to the drain of PMOS transistor P10, and a gate connected to the clock input, to receive the clock signal CLK. PMOS transistor P12 has a source connected to the drains of PMOS transistors P10 and P11, a drain connected to flipflop output node QZ, and a gate connected to flipflop output node Q.

NMOS transistor N10 has a source, a drain connected to flipflop output node QZ, and a gate connected to slave latch input node QS. NMOS transistor N11 has a source connected to ground, a drain connected to the source of transistor N10, and a gate connected to the clock input, to receive the clock signal CLK. NMOS transistor N12 has a source connected to ground, a drain connected to flipflop output node QZ, and a gate connected to flipflop output node Q.

In accordance with the present invention, the equivalent width of transistor N1 in series with transistor N3 must be wider than the equivalent width of transistor N7 in series with transistor N8. For example, this can be accomplished by making the width of transistor N3 equal to the width of transistor N8, and by making the width of transistor N1 greater than the width of transistor N7.

In addition, the equivalent width of transistor N4 in series with transistor N6 must also be wider than the equivalent width of transistor N11 in series with transistor N10. For example, this can be accomplished by making the width of transistor N6 equal to the width of transistor N10, and by making the width of transistor N4 greater than the width of transistor N11.

Furthermore, the equivalent width of transistor P1 in series with transistor P2 must be narrower than the equivalent width transistor P7 in series with transistor P9. For example, this can be accomplished by making the width of transistor P2 equal to the width of transistor P9, and by making the width of transistor P1 narrower than the width of transistor P7.

Finally, the equivalent width of transistor P4 in series with transistor P5 must also be narrower than the equivalent width of transistor P11 in series with transistor P12. For example, this can be accomplished by making the width of transistor P5 equal to the width of transistor P12, and by making the width of transistor P4 narrower than the width of transistor P11.

In operation, when the clock signal CLK rises, the master latch input nodes DM and DMZ are logically disconnected from the flipflop input nodes D and DZ, respectively. This occurs because the rising edge of the clock signal CLK turns on NMOS transistors N1 and N4. NMOS transistors N1 and N4 will begin to turn on when the rising edge of the clock signal CLK rises above the NMOS threshold voltage (VTN), thereby pulling down the voltages on the sources of transistors N3 and N6, regardless of the logic states on the master latch input nodes DM and DMZ.

When this occurs, either N3 or N6 will be turned on due to the complementary logic states present on the master latch output nodes QMZ and QM. As a result, transistor N1 or N4 will hold master latch output node QMZ or QM at a logic low, regardless of the logic states on the master latch input nodes DM and DMZ.

In addition, the rising clock signal CLK also turns off transistors P1 and P4, thereby isolating transistors P2 and P5, which are connected to the master latch input nodes DM and DMZ. Furthermore, PMOS transistor P3 or PMOS transistor P6 will be turned on in response to the complementary logic states on the master latch output nodes QM and QMZ, respectively.

In accordance with the present invention, after the master latch input nodes DM and DMZ have been logically disconnected from the flipflop input nodes D and DZ, respectively, the master latch output nodes QMZ and QM will be logically connected to the slave latch input nodes QSZ and QS, respectively.

More specifically, the rising clock signal CLK turns on transistors N7 and N11 which, in turn, cause the complementary logic states on the slave latch input nodes QSZ and QS to control whether NMOS transistor N8 or NMOS transistor N10 will be turned on. The rising clock signal CLK also turns off PMOS transistors P7 and P11 which, in turn, cause the complementary logic states on the slave latch input nodes QSZ and QS to control whether PMOS transistor P8 or PMOS transistor P10 will be turned on. Furthermore, NMOS transistor N9 or NMOS transistor N12 will be turned on in response to the complementary logic states on the flipflop output nodes QZ and Q, respectively.

In accordance with the present invention, transistors N1 and N3 in series sink more current (due to the size difference) than transistors N7 and N8 in series or transistors N10 and N11 in series. Similarly, transistors N4 and N6 in series sink more current (due to the size difference) than transistors N7 and N8 in series or transistors N10 and N11 in series.

Those skilled in the art will appreciate that the transistor size differences described above establish a lower switching threshold voltage for master latch 612 and an upper switching threshold voltage for slave latch 614. Thus, when the clock signal CLK is rising, the lower switching threshold voltage is traversed first, before the upper switching threshold voltage is traversed. In other words, when the clock signal CLK is rising, transistors N1 and N4 will turn on first, so that one of them can hold the logic state of master latch output node QMZ or QM to zero (thereby logically disconnecting the flipflop input nodes D and DZ from the master latch input nodes DM and DMZ). This event occurs before transistors N7 and N8 in series or transistors N10 and N11 in series can turn on hard, to source enough current to respond to the logic states of the master latch output nodes QMZ and QM (thereby logically connecting the master latch output nodes QMZ and QM to the slave latch input nodes QSZ and QS, respectively).

When the clock signal CLK is falling, the upper switching threshold voltage is traversed first, before the lower switching threshold voltage is traversed. In other words, when the clock signal CLK is falling, transistors N7 and N8 in series and transistors N10 and N11 in series will turn off first, sourcing insufficient current to respond to the logic states on the slave latch input nodes QSZ and QS (thereby logically disconnecting the master latch output nodes QMZ and QM from the slave latch input nodes QSZ and QS, respectively). This event occurs before master latch transistors N1 and N4 can sufficiently turn off, thereby logically connecting the flipflop input nodes D and DZ to the master latch input nodes DM and DMZ, respectively.

When the clock signal CLK is falling, PMOS transistors P7 and P11 will begin to turn on when their gate-to-source voltage exceeds the PMOS threshold voltage (VTP), thereby pulling up the voltages on the sources of transistors P9 and P12 respectively. Thus either P9 or P12 will be turned on, due to the complementary logic states present on the flipflop output nodes Q and QZ. As a result, transistor P7 or P11 will hold the flipflop output node Q or QZ at a logic high level, regardless of the logic states on the master latch output nodes QMZ and QM.

Furthermore, the falling clock signal CLK also begins to turn off transistors N7 and N11, thereby isolating transistors N8 and N10, which are connected to the master latch output nodes QMZ and QM, respectively. Thus NMOS transistor N9 or NMOS transistor N12 will be turned on, in response to the complementary logic states on the flipflop output nodes QZ and Q, respectively.

In accordance with the present invention, after the master latch output nodes QMZ and QM have been disconnected from the slave latch input nodes QSZ and QS, the master latch input nodes DM and DMZ will be connected to the flipflop input nodes D and DZ, respectively. Specifically, the falling clock signal CLK begins to turn on transistors P1 and P4 which, in turn, causes the complementary logic states on the master latch input nodes DM and DMZ to control whether PMOS transistor P2 or PMOS transistor P5 will be turned on.

The falling clock signal CLK also turns off transistors N1 and N4 which, in turn, causes the complementary logic states on the master latch input nodes DM and DMZ to control whether NMOS transistor N2 or NMOS transistor N5 will be turned on. Furthermore, PMOS transistor P3 or PMOS transistor P6 will be turned on in response to the complementary logic states on the flipflop output nodes QZ and Q, respectively.

Due to the transistor size differences described above, and in accordance with the present invention, series transistors P7 and P9 source more current than transistors P1 and P2 in series or transistors P4 and P5 in series. Similarly, due to the transistor size differences described above, series transistors P11 and P12 source more current than transistors P1 and P2 in series or transistors P4 and P5 in series.

As a result, when the clock signal CLK begins to fall, transistors P7 and P11 turn on harder first, before transistors P1 and P2 in series or transistors P4 and P5 in series. This behavior logically disconnects the master latch output nodes QMZ and QM from the slave latch input nodes QSZ and QS, before the master latch input nodes DM and DMZ are logically connected to the flipflop input nodes D and DZ.

Figure 7:
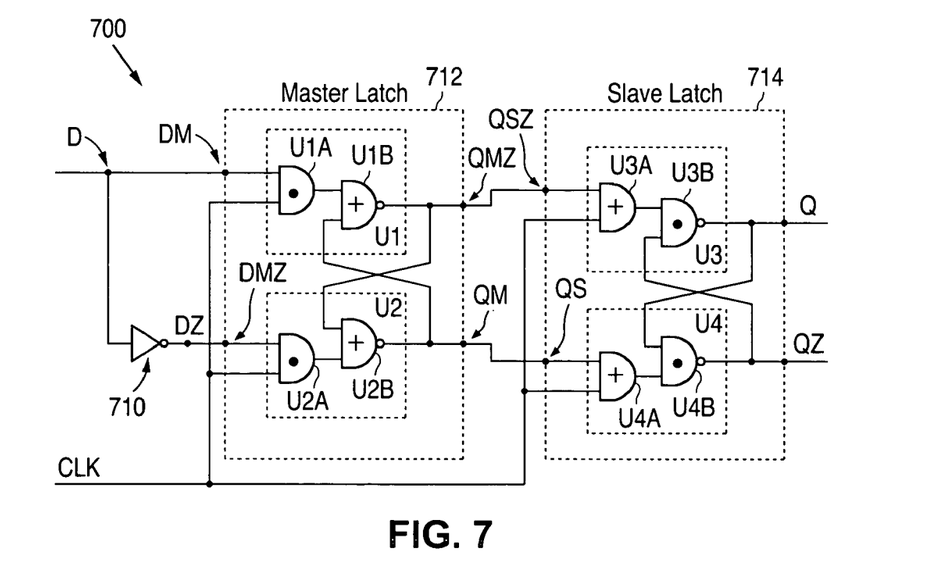
FIG. 7 is a logic diagram illustrating an example of a falling edge triggered D flipflop 700 in accordance with the present invention.

In accordance with the present invention, FIG. 7 shows a logic diagram that illustrates an example of a falling edge triggered D flipflop 700. Referring to FIG. 7, flipflop 700 includes a flipflop input node D, a flipflop input node DZ, and an inverter 710 that is connected between the flipflop input nodes D and DZ.

In addition, flipflop 700 also includes a master latch 712 that has a master latch input node DM and a master latch input node DMZ. As shown in FIG. 7, master latch input nodes DM and DMZ correspond to the flipflop input nodes D and DZ, respectively. Master latch 712 also has a master latch output node QMZ and a master latch output node QM.

As shown in FIG. 7, master latch 712 is composed of two cross-coupled complex gates U1 and U2, which are both AND-OR-INVERT (AOI) gates. In the FIG. 7 example, complex gate U1 includes an AND gate U1A and a NOR gate U1B. AND gate U1A has an output, and a first input connected to master latch input node DM, to receive the data input to flipflop 400. In addition, AND gate U1A also has a second input connected to the clock input of flipflop 700, to receive a clock signal CLK. NOR gate U1B has an output that generates a first intermediate signal on master latch output node QMZ, an input connected to the output of AND gate U1A, and an input connected to the output of complex gate U2.

Complex gate U2 includes an AND gate U2A and a NOR gate U2B. AND gate U2A has an output, and a first input connected to master latch input node DMZ, to receive an inverted data signal from inverter 710. Furthermore, AND gate U2A also has a second input connected to the clock input of flipflop 700, to receive the clock signal CLK. NOR gate U2B has an output that generates a second intermediate signal on master latch output node QM, an input connected to the output of AND gate U2A, and an input connected to the output of complex gate U1.

As further shown in FIG. 7, flipflop 700 includes a slave latch 714 that has a slave latch input node QSZ, a slave latch input node QS, a flipflop output node Q, and a flipflop output node QZ. Referring to FIG. 7, slave latch 714 is composed of two cross-coupled complex gates U3 and U4, which are OR-AND-INVERT (OAI) gates. As a result, slave latch 714 is the logical dual of master latch 712, which is composed of two cross-coupled AND-OR-INVERT (AOI) gates. Thus a key advantage of the present invention is that flipflop 700 does not require the complement of the clock signal (e.g., the inverted clock signal CLKZ).

As shown in the FIG. 7 example, complex gate U3 includes an OR gate U3A and a NAND gate U3B. OR gate U3A has an output, and a first input connected to slave latch input node QSZ, to receive the first intermediate signal from master latch output node QMZ. Furthermore, OR gate U3A also has a second input connected to the clock input of flipflop 700, to receive the clock signal CLK. NAND gate U3B has an output that generates a signal on the flipflop output Q, an input connected to the output of OR gate U3A, and an input connected to the output of complex gate U4.

Complex gate U4 includes an OR gate U4A and a NAND gate U4B. OR gate U4A has an output, and a first input connected to slave latch input node QS, to receive the second intermediate signal from master latch input node QM. Furthermore, OR gate U4A also has a second input connected to the clock input of flipflop 700, to receive the clock signal CLK. NAND gate U4B has an output that generates an inverted signal on flipflop output node QZ, an input connected to the output of OR gate U4A, and an input connected to the output of complex gate U3.

Those skilled in the art will appreciate that flipflop 700 is the logical dual of flipflop 400, and vice versa. Thus, as shown in FIGS. 4 and 7, the logical dual can be obtained by replacing the dots (AND functions) with pluses (OR functions), and by replacing the pluses (OR functions) with dots (AND functions).

Figure 8:
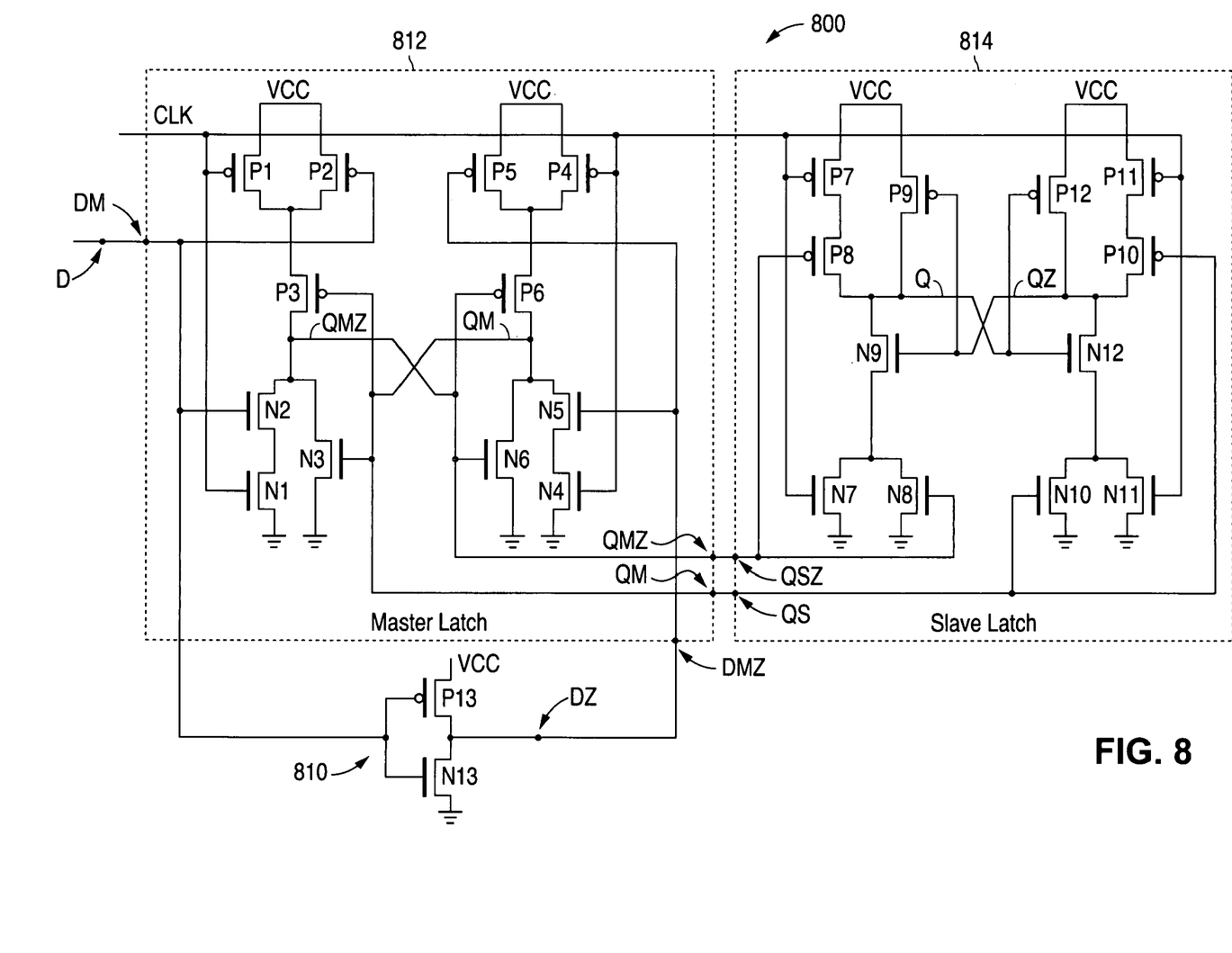
FIG. 8 is a schematic diagram illustrating an example of a falling edge triggered flipflop 800 in accordance with the present invention.

In accordance with the present invention, FIG. 8 shows a schematic diagram that illustrates a transistor level implementation of flipflop 700. As shown in FIG. 8, flipflop 800 includes a flipflop input node D, a flipflop input node DZ, and an inverter 810 that is connected between the flipflop input nodes D and DZ.

In addition, flipflop 800 also includes a master latch 812 that has a master input node DM and a master input node DMZ, that correspond with the flipflop input nodes D and DZ, respectively. Master latch 812 also has a master latch output node QMZ and a master latch output node QM. Furthermore, master latch 812 includes PMOS transistors P1-P3, and NMOS transistors N1-N3.

PMOS transistor P1 has a source connected to the power supply voltage VCC, a drain, and a gate connected to the clock input, to receive the clock signal CLK. PMOS transistor P2 has a source connected to the power supply voltage VCC, a drain connected to the drain of PMOS transistor P1, and a gate connected to master latch input node DM. PMOS transistor P3 has a source connected to the drains of PMOS transistors P1 and P2, a drain connected to master latch output node QMZ, and a gate connected to master latch output node QM.

NMOS transistor N1 has a source connected to ground, a drain, and a gate connected to the clock input, to receive the clock signal CLK. NMOS transistor N2 has a source connected to the drain of NMOS transistor N1, a drain connected to master latch output node QMZ, and a gate connected to master latch input node DM. NMOS transistor N3 has a source connected to ground, a drain connected to master latch output node QMZ, and a gate connected to master latch output node QM.

In addition, master latch 812 also includes PMOS transistors P4-P6, and NMOS transistors N4-N6. PMOS transistor P4 has a source connected to the power supply voltage VCC, a drain, and a gate connected to the clock input, to receive the clock signal CLK. PMOS transistor P5 has a source connected to the power supply voltage VCC, a drain connected to the drain of PMOS transistor P4, and a gate connected to master latch input node DMZ. PMOS transistor P6 has a source connected to the drains of PMOS transistors P4 and P5, a drain connected to master latch output node QM, and a gate connected to master latch output node QMZ.

NMOS transistor N4 has a source connected to ground, a drain, and a gate connected to the clock input, to receive the clock signal CLK. NMOS transistor N5 has a source connected to the drain of NMOS transistor N4, a drain connected to master latch output node QM, and a gate connected to master latch input node DMZ. NMOS transistor N6 has a source connected to ground, a drain connected to master latch output node QM, and a gate connected to master latch output node QMZ.

As further shown in FIG. 8, flipflop 800 also includes a slave latch 814 that has a slave input node QSZ, a slave input node QS, a flipflop output node Q, and a flipflop output node QZ. Slave latch 814 also includes PMOS transistors P7-P9, and NMOS transistors N7-N9. PMOS transistor P7 has a source connected to a power supply voltage VCC, a drain, and a gate connected to the clock input, to receive the clock signal CLK. PMOS transistor P8 has a source connected to the drain of PMOS transistor P7, a drain connected to flipflop output node Q, and a gate connected to slave latch input node QSZ. PMOS transistor P9 has a source connected to the power supply voltage VCC, a drain connected to flipflop output node Q, and a gate connected to flipflop output node QZ.

NMOS transistor N7 has a source connected to ground, a drain, and a gate connected to the clock input, to receive the clock signal CLK. NMOS transistor N8 has a source connected to ground, a drain connected to the drain of transistor N7, and a gate connected to slave latch input node QSZ. NMOS transistor N9 has a source connected to the drains of transistors N7 and N8, a drain connected to flipflop output node Q, and a gate connected to flipflop output node QZ.

Slave latch 814 also includes PMOS transistors P10-P12, and NMOS transistors N10-N12. PMOS transistor P10 has a source, a drain connected to flipflop output node QZ, and a gate connected to slave latch input node QS. PMOS transistor P11 has a source connected to the power supply voltage VCC, a drain connected to the source of transistor P10, and a gate connected to the clock input, to receive the clock signal CLK. PMOS transistor P12 has a source connected to the power supply voltage VCC, a drain connected to flipflop output node QZ, and a gate connected to flipflop output node Q.

NMOS transistor N10 has a source connected to ground, a drain, and a gate connected to slave latch input node QS. NMOS transistor N11 has a source connected to ground, a drain connected to the drain of transistor N10, and a gate connected to the clock input, to receive the clock signal CLK. NMOS transistor N12 has a source connected to the drains of transistors N10 and N11, a drain connected to flipflop output node QZ, and a gate connected to flipflop output node Q.

In accordance with the present invention, the equivalent width of transistor N1 in series with transistor N2 must be narrower than the equivalent width of transistor N7 in series with transistor N9. For example, this can be accomplished by making the width of transistor N2 equal to the width of transistor N9, and by making the width of transistor N1 narrower than the width of transistor N7.

In addition, the equivalent width of transistor N4 in series with transistor N5 must be narrower than the equivalent width of transistor N11 in series with transistor N12. For example, this can be accomplished by making the width of transistor N5 equal to the width of transistor N12, and by making the width of transistor N4 narrower than the width of transistor N11.

Furthermore, the equivalent width of transistor P1 in series with transistor P3 must be wider than the equivalent width transistor P7 in series with transistor P8. For example, this can be accomplished by making the width of transistor P3 equal to the width of transistor P8, and by making the width of transistor P1 wider than the width of transistor P7.

Finally, the equivalent width of transistor P4 in series with transistor P6 must be wider than the equivalent width transistor P11 in series with transistor P10. For example, this can be accomplished by making the width of transistor P6 equal to the width of transistor P10, and by making the width of transistor P4 wider than the width of transistor P11.

In operation, when the clock signal CLK rises, the master latch output nodes QMZ and QM are disconnected from the slave latch input nodes QSZ and QS, respectively. This occurs because the rising edge of the clock signal CLK turns on transistors N7 and N11. NMOS transistors N7 and N11 will begin to turn on when the rising edge of the clock signal CLK rises above the NMOS threshold voltage (VTN), thereby pulling down the voltages on the sources of transistors N9 and N12, regardless of the logic states on the master latch output nodes QMZ and QM.

When this occurs, either N9 and N12 will be turned on due to the complementary logic states present on the flipflop output nodes QZ and Q, respectively. As a result, transistor N7 or N11 will hold flipflop output node Q or QZ at a logic low, regardless of the logic states on the master latch output nodes QMZ and QM.

In addition, the rising clock signal CLK also turns off transistors P7 and P11, thereby isolating transistors P8 and P10, whose gates are connected to the master latch output nodes QMZ and QM, respectively. Furthermore, PMOS transistor P9 or PMOS transistor P12 will be turned on in response to the complementary logic states present on the slave latch output nodes Q and QZ.

In accordance with the present invention, after the master latch output nodes QMZ and QM have been logically disconnected from the slave input nodes QSZ and QS, respectively, the master latch input nodes DM and DMZ will be connected to the flipflop input nodes D and DZ, respectively.

More specifically, the rising clock signal CLK turns on transistors N1 and N4 which, in turn, cause the complementary logic states on the master latch input nodes DM and DMZ to control whether NMOS transistor N2 or NMOS transistor N5 will be turned on. The rising clock signal CLK also turns off PMOS transistors P1 and P4 which, in turn, cause the complementary logic states on the master latch input nodes DM and DMZ to control whether PMOS transistor P2 or PMOS transistor P5 will be turned on.

Furthermore, NMOS transistor N3 or NMOS transistor N6 will be turned on in response to the complementary logic states on the master latch output nodes QM and QMZ, respectively.

In accordance with the present invention, transistors N7 and N9 in series sink more current (due to the size difference) than transistors N1 and N2 in series or transistors N4 and N5 in series. Similarly, transistors N11 and N12 in series sink more current (due to the size difference) than transistors N1 and N2 in series or transistors N4 and N5 in series.

As a result, transistors N7 and N11 turn on so that one of the transistors can hold the logic state on flipflop output node Q or QZ to zero (thereby disconnecting the slave latch input nodes QSZ and QS from the master latch output nodes QMZ and QM) before transistors N1 and N2 in series or transistors N4 and N5 in series can turn on and source enough current to respond to the logic states on the master latch input nodes DM and DMZ (thereby connecting the master latch input nodes DM and DMZ to the flipflop input nodes D and DZ, respectively).

When the clock signal CLK begins to fall, the master latch input nodes DM and DMZ are disconnected from the flipflop input nodes D and DZ, respectively. This occurs because the falling edge of the clock signal CLK turns on transistors P1 and P4. PMOS transistors P1 and P4 begin to turn on when their gate to source voltage falls below the PMOS threshold voltage (VTP), thereby pulling up the voltage on the source nodes of transistors P3 and P6, regardless of the logic states on the master latch input nodes DM and DMZ.

Either P3 and P6 will be turned on, due to the logic states on the master latch output nodes QM and QMZ. As a result, transistor P1 or P4 will hold the master latch output node QMZ or QM at a logic high, regardless of the logic states on the master latch input nodes DM and DMZ.

In addition, the falling clock signal CLK also turns off transistors N1 and N4, thereby isolating transistors N2 and N5, which are connected to the master latch input nodes DM and DMZ, respectively. Furthermore, NMOS transistor N3 or NMOS transistor N6 will be turned on in response to the logic states present on the complementary master latch output nodes QM and QMZ.

In accordance with the present invention, after the master latch input nodes DM and DMZ have been disconnected from the flipflop input nodes DM and DMZ, the master latch output nodes QMZ and QM will be connected to the slave latch input nodes QSZ and QS, respectively. More specifically, the falling clock signal CLK turns on transistors P7 and P11 which, in turn, causes the logic states on the master latch output nodes QMZ and QM to control whether PMOS transistor P8 or PMOS transistor P10 will be turned on.

The falling clock signal CLK also turns off transistors N7 and N11 which, in turn, causes the logic states on the master latch output nodes QMZ and QM to control whether NMOS transistor N8 or NMOS transistor N10 will be turned on. Furthermore, PMOS transistor P9 or PMOS transistor P12 will be turned on in response to the complementary logic states present on the flipflop output nodes QZ and Q, respectively.

In accordance with the present invention, transistors P1 and P3 in series source more current (due to the size difference) than transistors P7 and P8 in series or transistors P10 and P11 in series. Similarly, transistors P4 and P6 in series source more current (due to the size difference) than transistors P7 and P8 in series or transistors P10 and P11 in series.

As a result, transistors P1 and P4 begin to turn on, so that one of them can hold the logic state on master latch output node QMZ or QM, respectively, to a logic high (thereby disconnecting the master latch input nodes DM and DMZ from the flipflop input nodes D and DZ). This event occurs before transistors P7 and P8 in series or transistors P10 and P11 in series can fully turn on, supplying enough current to respond to the logic states on the master latch output nodes QMZ and QM (thereby connecting the master latch output nodes QMZ and QM to the slave latch input nodes QSZ and QS).

It should be understood that the above descriptions are examples of the present invention, and that various alternatives of the invention described herein may be employed in practicing the invention. For example, although D flipflops are shown in FIG. 4 and FIG. 7, both of these flipflops can be easily transformed into other types of flipflops.

As an example, set-reset (SR) flipflops can be formed by simply omitting inverters 410 and 710, respectively. More specifically, when inverter 410 is removed from the D flipflop shown in FIG. 4, the DM input will become an active low SZ input, and the DMZ input will become an active low RZ input. Similarly, when inverter 710 is removed from the D flipflop shown in FIG. 7, the DM input will become an active high S input, and the DMZ input will become an active high R input.

It is intended that the following claims define the scope of the invention, and that structures and methods within the scope of these claims, including their equivalents, be covered thereby.

What is claimed is:

1. A flipflop comprising:
    a first complex gate having an output, a first input connected to a data node, and a second input connected to a clock node, the first complex gate including an OR-AND-INVERT (OAI) gate;
    a second complex gate having an output, a first input connected to the output of the first complex gate, and a second input connected to the clock node, the second complex gate including an AND-OR-INVERT (AOI) gate;
    a third complex gate having an output, a first input connected to an inverse data node, and a second input connected to the clock node, the output of the third complex gate being connected to the first complex gate, the output of the first complex gate being connected to the third complex gate, the third complex gate including an OR-AND-INVERT (OAI) gate;
    a fourth complex gate having an output, a first input connected to the output of the third complex gate, and a second input connected to the clock node, the output of the fourth complex gate being connected to the second complex gate, the output of the second complex gate being connected to the fourth complex gate, the fourth complex gate including an AND-OR-INVERT (AOI) gate; and
    an inverter connected between the data node and the inverse data node.

2. A flipflop comprising:
    a first complex gate having an output, a first input connected to a data node, and a second input connected to a clock node, the first complex gate including an OR-AND-INVERT (OAI) gate, the first complex gate including:
        a first PMOS transistor having a source connected to a power supply node, a drain, and a gate connected to the clock node; and
        a second PMOS transistor having a source connected to the drain of the first PMOS transistor, a drain, and a gate connected to the data node;
    a second complex gate having an output, a first input connected to the output of the first complex gate, and a second input connected to the clock node, the second complex gate including an AND-OR-INVERT (AOI) gate, the second complex gate including:
        a third PMOS transistor having a source connected to a power supply node, a drain, and a gate connected to the clock node; and
        a fourth PMOS transistor having a source connected to the drain of the third PMOS transistor, a drain, and a gate, the first and second PMOS transistors in series sourcing a smaller current than the third and fourth PMOS transistors in series;
    a third complex gate having an output, a first input connected to an inverse data node, and a second input connected to the clock node, the output of the third complex gate being connected to the first complex gate, the output of the first complex gate being connected to the third complex gate; and
    a fourth complex gate having an output, a first input connected to the output of the third complex gate, and a second input connected to the clock node, the output of the fourth complex gate being connected to the second complex gate, the output of the second complex gate being connected to the fourth complex gate.

3. The flipflop of claim 2 wherein:
    the first complex gate further includes:
        a first NMOS transistor having a source connected to ground, a drain, and a gate connected to the clock node; and
        a second NMOS transistor having a source connected to the drain of the first NMOS transistor, a drain, and a gate;
    the second complex gate further includes:
        a third NMOS transistor having a source connected to ground, a drain, and a gate connected to the clock node; and
        a fourth NMOS transistor having a source connected to the drain of the third NMOS transistor, a drain, and a gate, the first and second NMOS transistors in series sourcing a larger current than the third and fourth NMOS transistors in series.

4. A flipflop comprising:
    a first complex gate having an output, a first input connected to a data node, and a second input connected to a clock node, the first complex gate including an AND-OR-INVERT (AOI) gate, the first complex gate including:
        a first PMOS transistor having a source connected to a power supply node, a drain, and a gate connected to the clock node; and
        a second PMOS transistor having a source connected to the drain of the first PMOS transistor, a drain, and a gate, and
    a second complex gate having an output, a first input connected to the output of the first complex gate, and a second input connected to the clock node, the second complex gate including an OR-AND-INVERT (OAI) gate, the second complex gate including:
        a third PMOS transistor having a source connected to a power supply node, a drain, and a gate connected to the clock node; and
        a fourth PMOS transistor having a source connected to the drain of the third PMOS transistor, a drain, and a gate, the first and second PMOS transistors in series sourcing a larger current than the third and fourth PMOS transistors in series;

a third complex gate having an output, a first input connected to an inverse data node, and a second input connected to the clock node, the output of the third complex gate being connected to the first complex gate, the output of the first complex gate being connected to the third complex gate; and a fourth complex gate having an output, a first input connected to the output of the third complex gate, and a second input connected to the clock node, the output of the fourth complex gate being connected to the second complex gate, the output of the second complex gate being connected to the fourth complex gate.

5. The flipflop of claim 4 wherein:

the first complex gate further includes:
   a first NMOS transistor having a source connected to ground, a drain, and a gate connected to the clock node; and
   a second NMOS transistor having a source connected to the drain of the first NMOS transistor, a drain, and a gate connected to the data node, and the second complex gate further includes:
   a third NMOS transistor having a source connected to ground, a drain, and a gate connected to the clock node; and
   a fourth NMOS transistor having a source connected to the drain of the third NMOS transistor, a drain, and a gate, and the first and second NMOS transistors in series source a smaller current than the third and fourth NMOS transistors in series.

6. A flipflop comprising:

a master latch having a first transistor and a second transistor directly connected to a clock input, a third transistor connected to a first data input, a fourth transistor connected to a second data input, a first output, and a second output, the first transistor and the second transistor having the same conductivity type;

a slave latch having a fifth transistor and a sixth transistor directly connected to the clock input, a seventh transistor connected to the first output of the master latch, an eighth transistor connected to the second output of the master latch, a first output, and a second output, the fifth transistor and the sixth transistor having the same conductivity type; and an inverter having an input connected to the third transistor, and an output connected to the fourth transistor.

7. The flipflop of claim 6 wherein the first and second transistors turn on before the fifth and sixth transistors turn on when a clock signal on the clock input transitions from a logic low state to a logic high state.

8. The flipflop of claim 7 wherein the fifth and sixth transistors turn off before the first and second transistors turn off when the clock signal on the clock input transitions from the logic high state to the logic low state.

9. The flipflop of claim 8 wherein:

the master latch has a ninth transistor and a tenth transistor connected to the clock input;

the slave latch has an eleventh transistor and a twelfth transistor connected to the clock input; and the eleventh and twelfth transistors turn on before the ninth and tenth transistors turn on when the clock signal on the clock input transitions from the logic high state to the logic low state.

10. The flipflop of claim 9 wherein the ninth and tenth transistors turn off before the eleventh and twelfth transistors turn off when the clock signal on the clock input transitions from the logic low state to the logic high state.

11. The flipflop of claim 9 wherein the third and ninth transistors are connected in series, and the fourth and tenth transistors are connected in series.

12. The flipflop of claim 6 wherein the first and second transistors turn on after the fifth and sixth transistors turn on when a clock signal on the clock input transitions from a logic low state to a logic high state.

13. The flipflop of claim 12 wherein the fifth and sixth transistors turn off after the first and second transistors turn off when the clock signal on the clock input transitions from the logic high state to the logic low state.

14. The flipflop of claim 13 wherein:

the master latch has a ninth transistor and a tenth transistor connected to the clock input;

the slave latch has an eleventh transistor and a twelfth transistor connected to the clock input; and the eleventh and twelfth transistors turn on after the ninth and tenth transistors turn on when the clock signal on the clock input transitions from the logic high state to the logic low state.

15. The flipflop of claim 14 wherein the ninth and tenth transistors turn off after the eleventh and twelfth transistors turn off when the clock signal on the clock input transitions from the logic low state to the logic high state.

16. The flipflop of claim 14 wherein the seventh and twelfth transistors are connected in series, and the eighth and eleventh transistors are connected in series.

17. A method of operating a flipflop, the flipflop comprising:

a master latch having a first transistor and a second transistor directly connected to a clock input, a third transistor connected to a first data input, a fourth transistor connected to a second data input, a first output, and a second output, the first transistor and the second transistor having the same conductivity type;

a slave latch having a fifth transistor and a sixth transistor directly connected to the clock input, a seventh transistor connected to the first output of the master latch, an eighth transistor connected to the second output of the master latch, a first output, and a second output, the fifth transistor and the sixth transistor having the same conductivity type; and an inverter having an input connected to the third transistor, and an output connected to the fourth transistor, the method comprising:

receiving a clock signal on the clock input; and receiving a data signal on the data input.

18. The method of claim 17 and further comprising turning on the first and second transistors before turning on the fifth and sixth transistors when the clock signal on the clock input transitions from a logic low state to a logic high state.

19. The method of claim 18 and further comprising turning off the fifth and sixth transistors before turning off the first and second transistors when the clock signal on the clock input transitions from the logic high state to the logic low state.

20. The method of claim 19 wherein:

the master latch has a ninth transistor and a tenth transistor connected to the clock input;

the slave latch has an eleventh transistor and a twelfth transistor connected to the clock input; and further comprising:

turning on the eleventh and twelfth transistors before turning on the ninth and tenth transistors when the clock signal on the clock input transitions from the logic high state to the logic low state.

21. The method of claim 20 and further comprising turning off the ninth and tenth transistors before turning off the eleventh and twelfth transistors when the clock signal on the clock input transitions from the logic low state to the logic high state.

22. The method of claim 21 wherein the third and ninth transistors are connected in series, and the fourth and tenth transistors are connected in series.

23. The method of claim 17 and further comprising turning on the first and second transistors after turning on the fifth and sixth transistors when the clock signal on the clock input transitions from a logic low state to a logic high state.

24. The method of claim 23 and further comprising turning off the fifth and sixth transistors after turning off the first and second transistors when the clock signal on the clock input transitions from the logic high state to the logic low state.

25. The method of claim 24 wherein:

the master latch has a ninth transistor and a tenth transistor connected to the clock input; and the slave latch has an eleventh transistor and a twelfth transistor connected to the clock input; and further comprising:

turning on the eleventh and twelfth transistors after turning on the ninth and tenth transistors when the clock signal on the clock input transitions from the logic high state to the logic low state.

26. The method of claim 25 and further comprising turning off the ninth and tenth transistors after turning off the eleventh and twelfth transistors when the clock signal on the clock input transitions from the logic low state to the logic high state.

27. The method of claim 26 wherein the seventh and twelfth transistors are connected in series, and the eighth and eleventh transistors are connected in series.

* * * * *